(12) United States Patent
Reynolds et al.

(10) Patent No.: US 10,454,595 B2
(45) Date of Patent: Oct. 22, 2019

(54) SINGLE E-PROBE FIELD APERTURE COUPLER

(71) Applicant: The Boeing Company, Chicago, IL (US)

(72) Inventors: Robert Lee Reynolds, Newbury Park, CA (US); Martin William Bieti, Tujunga, CA (US); Robert Rim Choo, Torrance, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/811,302

(22) Filed: Nov. 13, 2017

(65) Prior Publication Data

US 2018/0109333 A1   Apr. 19, 2018

Related U.S. Application Data

(63) Continuation-in-part of application No. 15/293,014, filed on Oct. 13, 2016, now Pat. No. 10,097,285.

(51) Int. Cl.
| | |
|---|---|
| H01Q 13/02 | (2006.01) |
| H04B 17/10 | (2015.01) |
| G01R 29/08 | (2006.01) |
| H01Q 1/38 | (2006.01) |
| H01Q 1/12 | (2006.01) |
| H01Q 1/28 | (2006.01) |

(52) U.S. Cl.
CPC ....... *H04B 17/102* (2015.01); *G01R 29/0878* (2013.01); *H01Q 1/125* (2013.01); *H01Q 1/288* (2013.01); *H01Q 1/38* (2013.01); *H01Q 13/02* (2013.01)

(58) Field of Classification Search
CPC ...... G01R 29/08; G01R 29/10; H04B 17/102; H01Q 13/02
See application file for complete search history.

(56) References Cited

U.S. PATENT DOCUMENTS

| | | | |
|---|---|---|---|
| 5,517,203 A * | 5/1996 | Fiedziuszko | H01P 1/2086 333/202 |
| 6,452,561 B1 * | 9/2002 | West | H01Q 13/0258 343/772 |
| 6,507,323 B1 * | 1/2003 | West | H01P 1/161 343/772 |
| 6,720,932 B1 | 4/2004 | Flynn et al. | |
| 7,511,678 B2 | 3/2009 | Wu | |
| 9,470,732 B2 | 10/2016 | Reynolds et al. | |

* cited by examiner

*Primary Examiner* — Dameon E Levi
*Assistant Examiner* — Hasan Z Islam
(74) *Attorney, Agent, or Firm* — Gates & Cooper LLP

(57) ABSTRACT

A temporary microwave horn antenna coupling device is configured for collecting or injecting quantifiable samples of RF energy. The device comprises single electric field probe mounted at the radiating aperture of a radiating payload. The electric field probe can be oriented at 45 degrees to the horizontal and vertical electric fields of a linearly polarized antenna, or oriented for a single linear polarization to the electric field in a circular polarized antenna. The electric field probe is connected to an attenuator and/or lossy cable for reduced reflections and gradient thermal dissipation.

29 Claims, 16 Drawing Sheets

TEMPERATURE PREDICTION OF E-PROBE LOSSY MEGGITT SiO$_2$ CABLE
ROBERT CHOO ROBERT REYNOLDS 6/21/2016

ASSUMPTIONS
  MEGGITT SiO$_2$ CABLE IS ENCAPSULATED STAINLESS (SS) STEEL CABLE
  ALLOWABLE TEMPERATURE RANGE OF THE MEGGITT SiO$_2$ CABLE IS FROM -200C TO +950C
  IF THERE'S A TEFLON MATERIAL NEARBY THE E-PROBE , IT SHOULD BE GOOD TO ABOUT 260C
  (500F)TO 315C (600F)], THEN THE E-PROBE TEMP SHOULD BE LIMITED TO NEAR SAME TEMP
  dB LOSS OF A 0.09" DIAMETER CABLE IS =-0.7 dB/FT @ Ku,-1.1 DB/FT@ Ka, -1.6 dB/FT @ Q
  STAINLESS STEEL EMISSIVITY RANGE: 0.11 (POLISHED) TO 0.14 (TYPICAL)
  EMISSIVITY OF PAINT: ~ 0.85
  $Q_{ALLOWABLE\ CABLE\ DISSIPATION} \sim = (E)(F_{C-ENV1})(A)(SIGMA)(T^4_{CABLE} - T^4_{ENV1}4) + (E)(F_{C-ENV2})$

| dB LOSS PER FOOT BASIS (LESS CONSERVATIVE) | E | FAL OR COMMON ABSRBR, $T_{ENV1}$ | | FAP MOUNTING PLATE, $T_{ENV2}$ | | CABLE SURFACE AREA (A) (0.09" DIA X1FT LONG FT^2 | SIGMA W/FT$^2$K$^4$ |
|---|---|---|---|---|---|---|---|
| | | $F_{C-ENV1}$ | (60C) C | $F_{C-ENV2}$ | (150C) C | | |
| CABLE-WITH POLISHED STAINLESS STEEL | 0.11 | 0.4 | 60 | 0.6 | 150 | 0.0236 | 5.27E-09 |
| CABLE-WITH TYPICAL STAINLESS STEEL | 0.14 | 0.4 | 60 | 0.6 | 150 | 0.0236 | 5.27E-09 |
| CABLE-WITH TYPICAL HIGH TEMPERATURE PAINT | 0.85 | 0.4 | 60 | 0.6 | 150 | 0.0236 | 5.27E-09 |
| CABLE-WITH VERY HIGH TEMP PAINT | 0.85 | 0.4 | 60 | 0.6 | 150 | 0.0236 | 5.27E-09 |
| CABLE-WITH SPECIAL PAINT LIMITED BY TEFLON | 0.85 | 0.4 | 60 | 0.6 | 150 | 0.0236 | 5.27E-09 |
| CABLE-WITH EXTREMELY HIGH TEMP PAINT | 0.85 | 0.4 | 60 | 0.6 | 150 | 0.0236 | 5.27E-09 |

| dB LOSS PER FOOT BASIS (A LIMITING CASE) | E | FAL OR COMMON ABSRBR, $T_{ENV1}$ | | FAP MOUNTING PLATE, $T_{ENV2}$ | | CABLE SURFACE AREA (A) (0.09" DIA X1IN LONG FT^2 | SIGMA W/FT$^2$K$^4$ |
|---|---|---|---|---|---|---|---|
| | | $F_{C-ENV1}$ | (60C) C | $F_{C-ENV2}$ | (150C) C | | |
| CABLE-WITH POLISHED STAINLESS STEEL | 0.11 | 0.4 | 60 | 0.6 | 150 | 0.00196 | 5.27E-09 |
| CABLE-WITH TYPICAL STAINLESS STEEL | 0.14 | 0.4 | 60 | 0.6 | 150 | 0.00196 | 5.27E-09 |
| CABLE-WITH TYPICAL HIGH TEMPERATURE PAINT | 0.85 | 0.4 | 60 | 0.6 | 150 | 0.00196 | 5.27E-09 |
| CABLE-WITH VERY HIGH TEMP PAINT | 0.85 | 0.4 | 60 | 0.6 | 150 | 0.00196 | 5.27E-09 |
| CABLE-WITH SPECIAL PAINT LIMITED BY TEFLON | 0.85 | 0.4 | 60 | 0.6 | 150 | 0.00196 | 5.27E-09 |
| CABLE-WITH EXTREMELY HIGH TEMP PAINT | 0.85 | 0.4 | 60 | 0.6 | 150 | 0.00196 | 5.27E-09 |

CONCLUSION:
E-PROBE ARE DESIGNED TO BE THERMALLY COOLED PASSIVELY AND HAVE LOW COUPLING TO THE RF FIELD INTENSITY TO HANDLE HIGH RF POWER INTENSITY .
THE USE OF MEGGITT CABLES THAT CAN HANDLE EXTREME TEMPERATURE RANGE, ALONG WITH VACUUM COMPATIBLE HIGH TEMPERATURE PAINT WILL ALLOW HIGH RF POWER HANDLING CAPABILITY.
LOSSY MEGGITT CABLE/S CAN BE REPLACED WITH CERTAIN SIZED RF LOADS WITH RADIATIVE FINS TO PROVIDE PASSIVE RADIATIVE COOLING AND TEMPERATURE CONTROL.
IN ADDITION, THE LOCATION OF THE E-PROBE CAN BE ADJUSTED FROM HIGH TO LOW FIELD INTENSITY REGIONS WITHIN THE FIELD APERTURE PROBE TO FIND THE RIGHT BALANCE BETWEEN THE RETURN LOSS AND RF COUPLING.

*FIG. 9A*

| $(A)(SIGMA)(T_{CABLE}^4 - T_{ENV2}^4)$ ALLOWABLE LIMIT, $T_{CABLE}$ (245C-SS) (149C-PAINT) (2150-PAINT) (260-PAINT) (300C-PAINT) | MAX ALLOWABLE HEAT DISSIPATION IN LOSSY CABLE $Q_{DISS}$/FT | MAX ALLOWABLE E-PROBE INPUT POWER FOR -1.1)dB/FT (@Ka) LOSSY CABLE | MAX ALLOWABLE POWER AT 20dB UP $(2^{15/3})=32X$ (LOWEST COUPLING CASE) | MAX ALLOWABLE POWER AT 20dB UP $(2^{20/3})$-102X | MAX ALLOWABLE POWER AT 25dB UP $(2^{25/3})=323X$ (NOMINAL COUPLING CASE) | MAX ALLOWABLE POWER AT 30dB UP $(2^{30/3})=1024X$ (HIGHEST COUPLING CASE) |
|---|---|---|---|---|---|---|
| C | WATTS/FT | WATTS | WATTS | WATTS | WATTS | WATTS |
| 245 | 0.65 | 2.9 | 94 | 297 | 944 | 2998 |
| 245 | 0.83 | 3.7 | 119 | 1201 | 1201 | 3814 |
| 134 | 0.35 | 1.6 | 50 | 505 | 505 | 1602 |
| 200 | 2.74 | 12.2 | 392 | 3950 | 3950 | 12541 |
| 245 | 5.06 | 22.6 | 724 | 7293 | 7293 | 23154 |
| 285 | 7.70 | 34.4 | 1101 | 11093 | 11093 | 35219 |

| ALLOWABLE LIMIT, $T_{CABLE}$ (245C-SS) (149C-PAINT) (2150-PAINT) (260-PAINT) (300C-PAINT) | MAX ALLOWABLE HEAT DISSIPATION IN LOSSY CABLE $Q_{DISS}$/IN | MAX ALLOWABLE E-PROBE INPUT POWER FOR (-1.1/12)dB/FT (@Ka) LOSSY CABLE | MAX ALLOWABLE POWER AT 20dB UP $(2^{15/3})=32X$ (LOWEST COUPLING CASE) | MAX ALLOWABLE POWER AT 20dB UP $(2^{20/3})$-102X | MAX ALLOWABLE POWER AT 25dB UP $(2^{25/3})=323X$ (NOMINAL COUPLING CASE) | MAX ALLOWABLE POWER AT 30dB UP $(2^{30/3})=1024X$ (HIGHEST COUPLING CASE) |
|---|---|---|---|---|---|---|
| C | WATTS/FT | WATTS | WATTS | WATTS | WATTS | WATTS |
| 245 | 0.05 | 2.6 | 84 | 265 | 843 | 2675 |
| 245 | 0.07 | 3.3 | 106 | 338 | 1072 | 3405 |
| 134 | 0.03 | 1.4 | 45 | 142 | 451 | 1403 |
| 200 | 0.23 | 10.9 | 350 | 1111 | 3527 | 11196 |
| 245 | 0.42 | 20.2 | 646 | 2051 | 6511 | 20671 |
| 285 | 0.64 | 30.7 | 983 | 3119 | 9904 | 31443 |

*FIG. 9B*

TYPICAL HORN COVER (SS #2 SHOWN)

US 10,454,595 B2

SINGLE E-PROBE FIELD APERTURE COUPLER

CROSS REFERENCE TO RELATED APPLICATIONS

This application is a continuation in part of U.S. patent application Ser. No. 15/293,014, entitled "SINGLE E-PROBE REDUCED APERTURE WAVEGUIDE COUPLER," by Robert Lee Reynolds et al., filed Oct. 13, 2016, which application is hereby incorporated by reference herein.

TECHNICAL FIELD

The subject matter of this application relates generally to the field of satellite microwave payload test equipment, and more particularly to a system and method for testing electronics associated with a horn antenna.

BACKGROUND

High powered horn antennas, such as those used in satellite communications, can produce a focused high flux density that creates challenges for testing the communication electronics attached to a horn antenna. To test attached electronics, one typical configuration includes a Radio Frequency (RF) absorber backed by an actively cooled aluminum plate positioned in front of the horn antenna. A thin aluminum shroud surrounding the space between the absorber and the horn antenna can be added to create a Field Aperture Load (FAL) configuration. Limits on the absorption and cooling rate of the FAL configuration limit the maximum allowable flux density at the absorber pad. To reduce the flux density at the absorber pad, the absorber pad can be moved farther from the horn antenna such that the energy emitted from the horn is more diffuse and has a sufficiently low maximum flux density at the absorber. As the absorber pad moves further from the horn, the entire FAL, including the aluminum shroud, must grow. However, large test configurations can create increased costs and other challenges, especially during Spacecraft Thermal Vacuum (SCTV) testing, which requires an entire test configuration to fit within a vacuum chamber. Large vacuum chamber testing facilities are generally expensive with limited schedule availability.

Existing solutions have additionally involved the use of air links including probe antennas at some distance in front of the antenna under test. In some cases they have been installed at the reflector focal point to quantitatively couple RF to the satellite. This has required the use of large vacuum chambers, with limited availability, and expensive supporting structure with excessive setup time. Control of reflections causing multipath or in-band ripple is also a major issue with air links.

Another solution is the recently developed "Field Aperture Load Coupler" described in co-pending U.S. patent application Ser. No. 14/273,329, which uses a waveguide coupled reduced radiating aperture with integrated directional electric field probe (E-probe) coupler. The advantage of this method is the reduced radiating aperture spreads the radiated transmit flux over a broader area such that shorter distance to the absorber is tolerated without overheating. The use of the directional coupler allows testing in a partially reflective environment. The drawback of this method is limited power handling due to the thermal constraints and expense of the E-probe directional coupler components.

SUMMARY

A goal of the present disclosure is to provide an improved system for testing electronics associated with a horn antenna, wherein the system can work in smaller vacuum chamber testing facilities and without internal couplers. The inventive configuration employs a reduced radiating aperture of the type described in U.S. patent application Ser. No. 14/273,329, "Compact Spacecraft Antenna Field Aperture Load Coupler," filed on May 8, 2014, which is inserted into a microwave energy radiating antenna horn for collecting or injecting quantifiable samples of RF energy. However, the present disclosure uses a single electric field probe in the surrogate waveguide and avoids the need for directional test coupler components otherwise needed for testing newer spacecraft payload designs having many spot beams that do not have internal test couplers designed into the spacecraft. Although it requires a less reflective environment, the single E-probe configuration of the present disclosure takes advantage of the same reduced radiating aperture while reducing expense and increasing power handling by 3 to 10 times. Two embodiments using a single E-probe are disclosed: a first embodiment in which the single electric field probe is used in conjunction with the surrogate waveguide, and a second embodiment in which the single electric field probe is disposed proximate a periphery of the radiation aperture of a horn.

In an illustrative embodiment of the present disclosure, a system for testing electronics associated with a horn antenna comprises a surrogate waveguide inserted into the horn antenna. In addition, a power attenuation device is coupled to the E-probe, a mounting plate is mounted at a flared end of the horn antenna, and a radiation absorbing surface is positioned facing a primary direction of energy propagation from the flared end of the aperture portion of the surrogate waveguide. Moreover, the surrogate waveguide includes a slip fit portion, an electric field probe (E-probe) housing, and an aperture portion, and the E-probe housing includes a single E-probe. The slip fit portion is positioned inside the horn antenna, and the E-probe housing and aperture portion are positioned outside the horn antenna. The electric field probe can be oriented at 45 degrees to the horizontal and vertical electric fields of a linearly polarized antenna, or oriented for a single linear polarization to the electric field in a circular polarized antenna.

The present disclosure also provides a method for testing electronics associated with a horn antenna. An illustrative example includes the step of inserting a surrogate waveguide into the horn antenna, wherein the surrogate waveguide comprises a slip fit portion, an E-probe housing, and an aperture portion. The inventive method further comprises attaching a mounting plate at a flared end of the horn antenna; positioning the surrogate waveguide and horn antenna such that a radiation absorbing surface faces a primary direction of energy propagation from the flared end of the aperture portion of the surrogate waveguide; injecting a first radio frequency (RF) signal into the surrogate waveguide, thereby causing electromagnetic energy to couple into electronics which may, in turn, reradiate electromagnetic energy in the opposite direction and be radiated from the aperture of the surrogate waveguide and absorbed by the radiation absorbing surface; and measuring a second RF signal detected by the E-probe inside the surrogate waveguide.

Other features of the present disclosure are described below.

BRIEF DESCRIPTION OF THE DRAWINGS

The following detailed description may be better understood when read in conjunction with the appended drawings. For the purposes of illustration, various examples of aspects of the disclosure are shown in the drawings.

FIGS. 9A and 9B depict a table of temperature calculations and assumptions for various kinds of cables used in embodiments of the present disclosure.

DETAILED DESCRIPTION OF ILLUSTRATIVE EMBODIMENTS

Measurements with single e-probes may be performed at least two embodiments. In a first embodiment, the single e-probe is used in conjunction with a reduced aperture waveguide coupler, as described in co-pending application Ser. No. 15/293,014, entitled "SINGLE E-PROBE REDUCED APERTURE WAVEGUIDE COUPLER," by Robert Lee Reynolds et al., filed Oct. 16, 2013, hereby incorporated by reference herein. In a second embodiment, the single e-probe is disposed proximate the field aperture of the horn antenna.

Single E-Probe Field Aperture Coupler with Surrogate Waveguide

Figure 1:
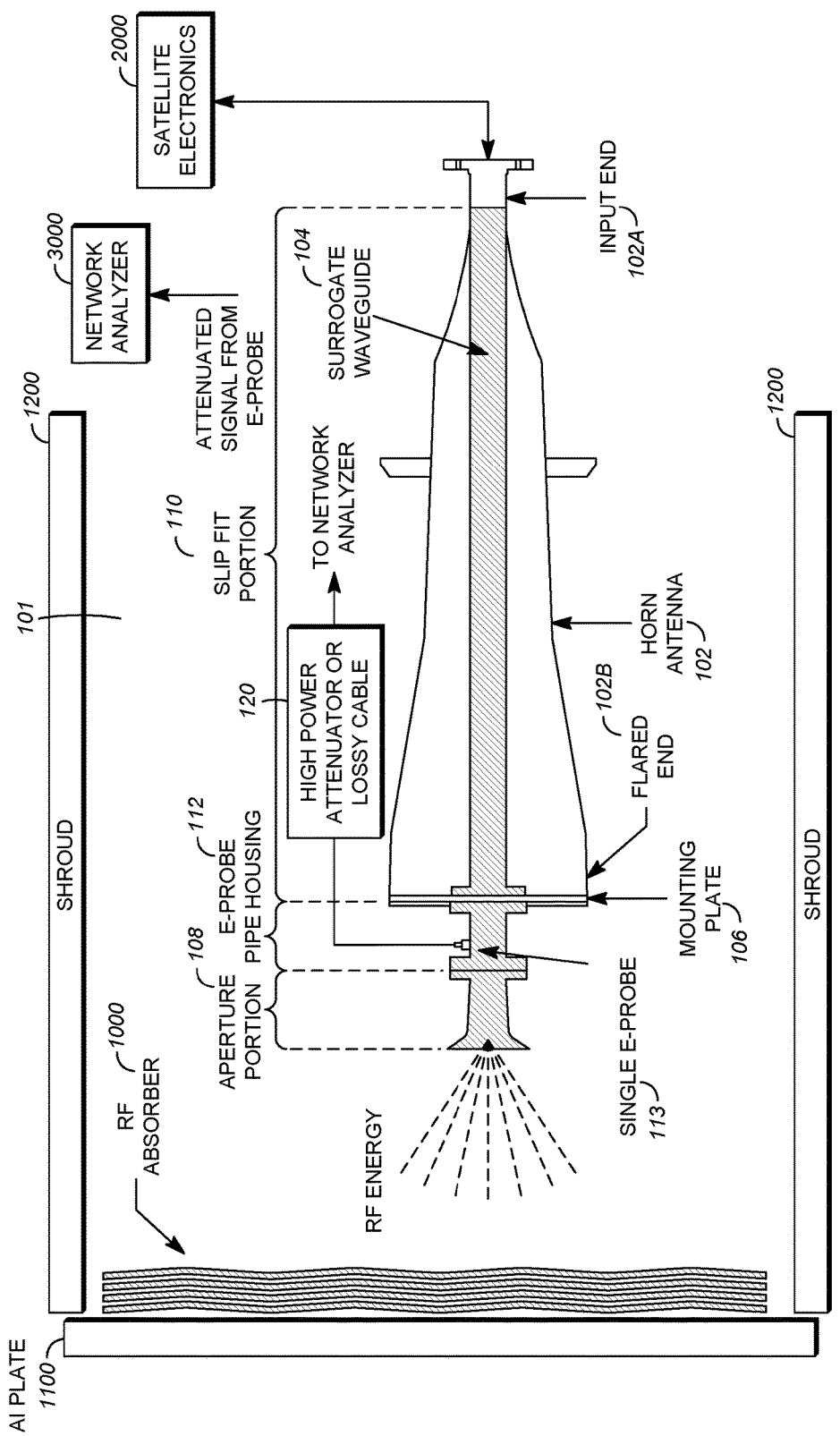
FIG. 1 illustrates a surrogate waveguide mounted in a horn antenna with an external E-probe.

The present disclosure of the embodiments of the single e-probe field aperture coupler may be embodied as shown in FIG. 1. As shown, this embodiment eliminates one of the electric field probes, the 3 dB hybrid, load, and attenuator of the system described in U.S. patent application Ser. No. 14/273,329. The single probe can be cut electrically large, to a length that will resonate and be somewhat impedance matched, or it can be cut electrically short to decouple perturbations of the internal waveguide fields but will have a poor return loss. The poor return loss can be compensated by adding an attenuator directly at the probe connector. However, high power configurations may still have too much coupled power for the attenuator to dissipate especially during vacuum testing in SCTV. To avoid this problem, a lossy cable can be used with or in place of the attenuator such that the excess power can be dissipated over a greater surface area. The single electric field probe works in combination with low reflectivity free space absorber, a highly aperture matched spline horn, and an attenuator and/or a lossy cable to minimize reflections that cause multipath ripple.

It should be noted that those skilled in the art understand the structure of a spline horn. The term "spline" is a mathematical term used to describe the shape of the horn. For example, the spline horn may be constructed using a five-point cubic-spline profile, with the inner three points optimized to give the best return loss. The probe is rotated 45° to the electric field in linear polarized systems. A second like probe may be added to the opposite side of the waveguide and loaded to minimize higher order moding. This particular design was maximized for low return loss (reflectivity), and matching the waveguide to free space. If the reflected RF energy is less than or equal to −37 dB, a directional coupler is not required for low ripple measurements.

FIG. 1 depicts an example apparatus used to test a microwave frequency payload. Flight horn 102 has a microwave frequency payload attached and is the antenna connected to the payload electronics being tested. If the payload electronics being tested are for a satellite, flight horn 102 and its attached electronics will be sent into orbit on a satellite, while the other components depicted are used only during testing on the ground. The payload electronics being tested, however, need not be part of a satellite for the disclosed examples to be a useful aid in testing; any payload with a horn antenna can be tested using the disclosed principles.

A surrogate waveguide 104 is secured in the flight horn 102, and comprises several portions. The slip-fit portion 110 of a surrogate waveguide 104 has one end slip-fit into the narrow end of the flight horn 102, and the other end of the slip-fit portion is attached to a mounting plate 106 that is attached to the aperture end (wide end) of the flight horn 102. The mounting plate 106 has a hole in its center to form a thin portion of the surrogate waveguide 104 as shown, but can be designed to attach only to the exterior and cinch down to any point along the exterior of the surrogate waveguide 104. In this example, an E-probe housing 112 forms the next portion of the surrogate waveguide 104 and is attached to the outside of the mounting plate 106. Note, however, that an E-probe housing is not necessary for all test configurations that benefit from the reduced peak flux density. However, many modern satellites have many horn antennas and do not have internal test couplers designed into the spacecraft. An E-probe integrated into a surrogate waveguide is useful for testing such modern satellite systems. Details of the E-probe are provided below. The last portion of the surrogate waveguide 104 is the aperture portion 108, which at one end is attached to the E-probe housing, and the other end is a flared aperture. The final aperture flare size is smaller than the aperture size of the flight horn 102. For example, a flight horn 102 designed for Ku-Band satellite communication may have a 5 inch aperture, while the aperture end of the surrogate waveguide may be 2 inches. The reduced aperture of the surrogate waveguide causes the radiated RF energy to be less focused, thus leading to a reduction in peak flux density of approximately one-fifth the peak flux density without the surrogate waveguide. As discussed above, a benefit of using a surrogate waveguide with a radiating aperture that is smaller than the aperture of the horn antenna is that this spreads the radiated transmit flux over a broader area, such that the absorber can be moved closer to the radiating aperture without overheating. The ratio of diameter of the surrogate waveguide aperture to the diameter of the horn antenna aperture could be 0.40 (as in the 2 in./5 in. example above), but other ratios may also be used depending on the overall space constraints of the test setup.

This reduction in aperture has enabled the use of Emerson & Cuming SF resonant free space absorber at close range in an embodiment of U.S. patent application Ser. No. 14/273,329, which utilizes a directional dual E-probe coupler. However, the current disclosure of embodiments without a directional coupler would experience excessive ripple over portions of the required bandwidth in that configuration due to high reflectivity outside of the narrow tuning range of the SF material. Replacing SF absorber with a broadband vacuum compatible high power absorber (such as Cuming Microwave C-RAM SFC-HC) enables low reflectivity, resulting in low ripple with a single E-probe waveguide coupler as long as the distance to the absorber is increased to accommodate the lower power handling capability of C-RAM. This is an acceptable trade for larger chambers considering the increased power handling capability of the single E-probe waveguide coupler and considering the expanded frequency capability of the C-RAM absorber. The combination of the single probe waveguide coupler and the C-RAM absorber now enables testing high power payloads over broadband frequencies such that multiple frequency mixed high power payloads can be tested within the same expanded FAL.

Aluminum plate 1100 provides radio frequency (RF) shielding and heat dissipation for RF absorber 1000. The aluminum plate typically has channels or tubing that enables liquid cooling for RF absorber 1000. The RF absorber may be directly and thermally attached to the plate or be radiative cooled by applying a high thermal emissivity coating to the surface of the aluminum plate.

Shroud 1200 is attached to the aluminum plate and extends the RF and thermal shield to confine and protect the feed radiation plus probe assemblies back to or near the spacecraft thermal protective blankets. Network Analyzer 3000 may include a discrete COTS (Commercial Off The Shelf) radio frequency analyzer and/or custom STE (Special Test Equipment) designed to initiate, collect, and measure RF magnitude, phase, and group delay in order to sample and quantify the satellite performance in SCTV and ambient testing.

While the interior surfaces of the surrogate waveguide's transmission path (the portion that propagates microwave energy) are bare metal such as aluminum, any or all of the exterior surfaces of the surrogate waveguide may be coated with a highly thermally emissive material such as anodization or high temperature paint. The materials used to make many of the test apparatus elements can be thermally emissive, and many neighboring elements can be thermally coupled. For example, all portions of the surrogate waveguide 104 and the mounting plate 106 are preferably made from materials with high thermal emissivity and can all be thermally coupled to each other. Anodized aluminum can be used to provide both thermal emissivity and electrical decoupling to prevent spurious electrical currents at contact points between the surrogate waveguide and the flight horn that may cause unwanted frequency spreading interference. In addition, an anodized layer can also prevent galling where neighboring parts rub against each other, such as where the surrogate waveguide 104 is slip-fit into the narrow end of the flight horn 102. The mounting plate may comprise anodized aluminum and be configured to thermally couple with and support the surrogate waveguide, or thermal plastic only providing support.

A surrogate waveguide can have many shapes, such as circular or rectangular; however, circular surrogate waveguides are depicted. The shape of a surrogate waveguide may be similar to the narrow end of the flight horn, and the interior cross-sectional dimension of the surrogate waveguide may often be within a few percent of the interior cross-sectional dimension of the horn input waveguide where the slip-fit portion is mated to the flight horn to maintain an electrical match. The end of the slip-fit portion is machined to minimize differences in the dimensions, and matching rings or other elements can be added to reduce coupling mismatch.

In one embodiment, the surrogate waveguide with a circular cross-section is constructed of aluminum with an anodized exterior surface, and is slip-fitted into the horn antenna. In this embodiment, the aperture portion extends beyond the flared end of the horn antenna, the diameter of the surrogate waveguide is constant in the slip-fit portion and E-probe housing, and the aperture portion of the surrogate waveguide is smaller than the aperture of the horn antenna.

Figure 7:
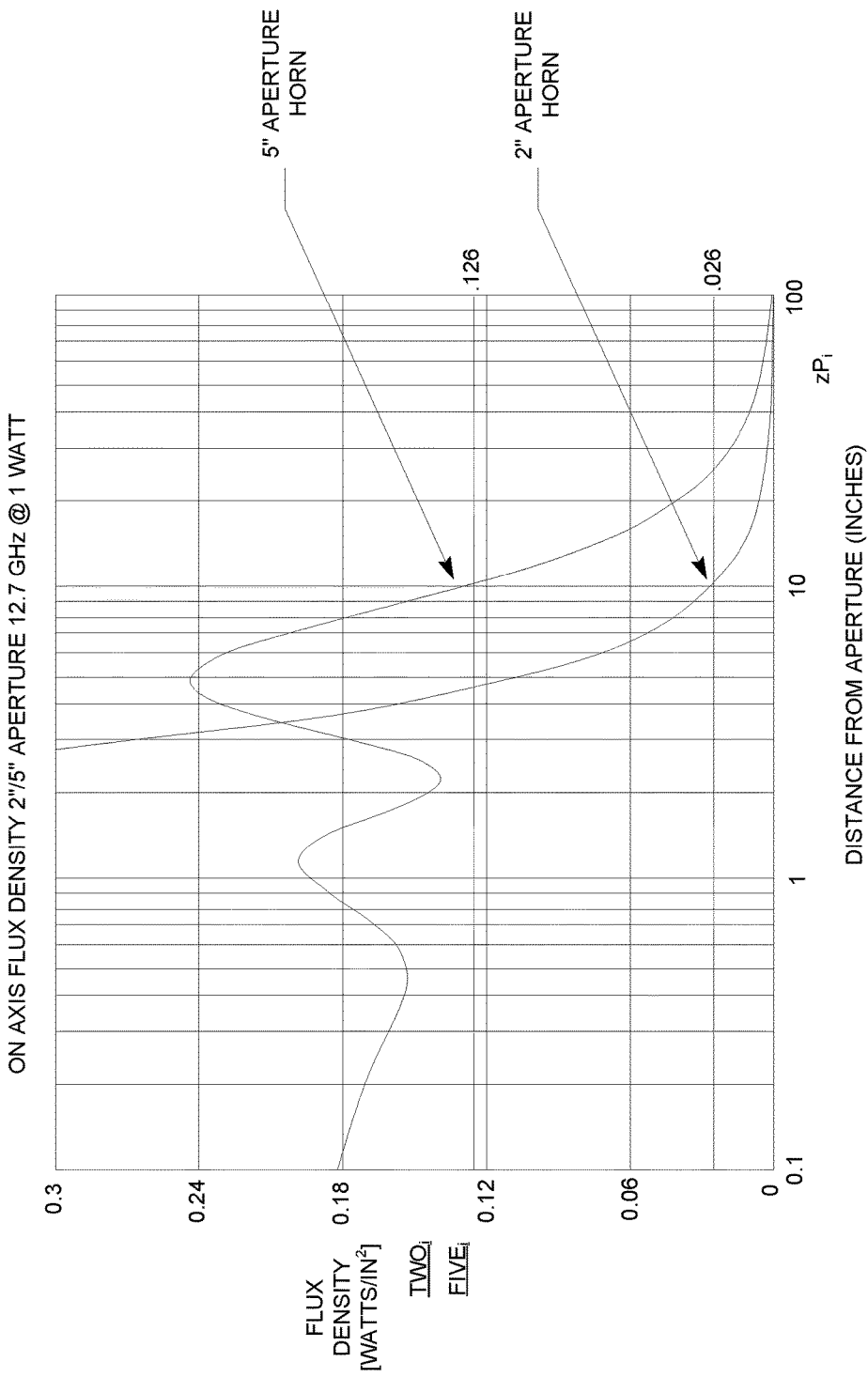
FIG. 7 illustrates the flux density difference between a 5" aperture flight horn and a 2" aperture surrogate waveguide.
Figure 8:
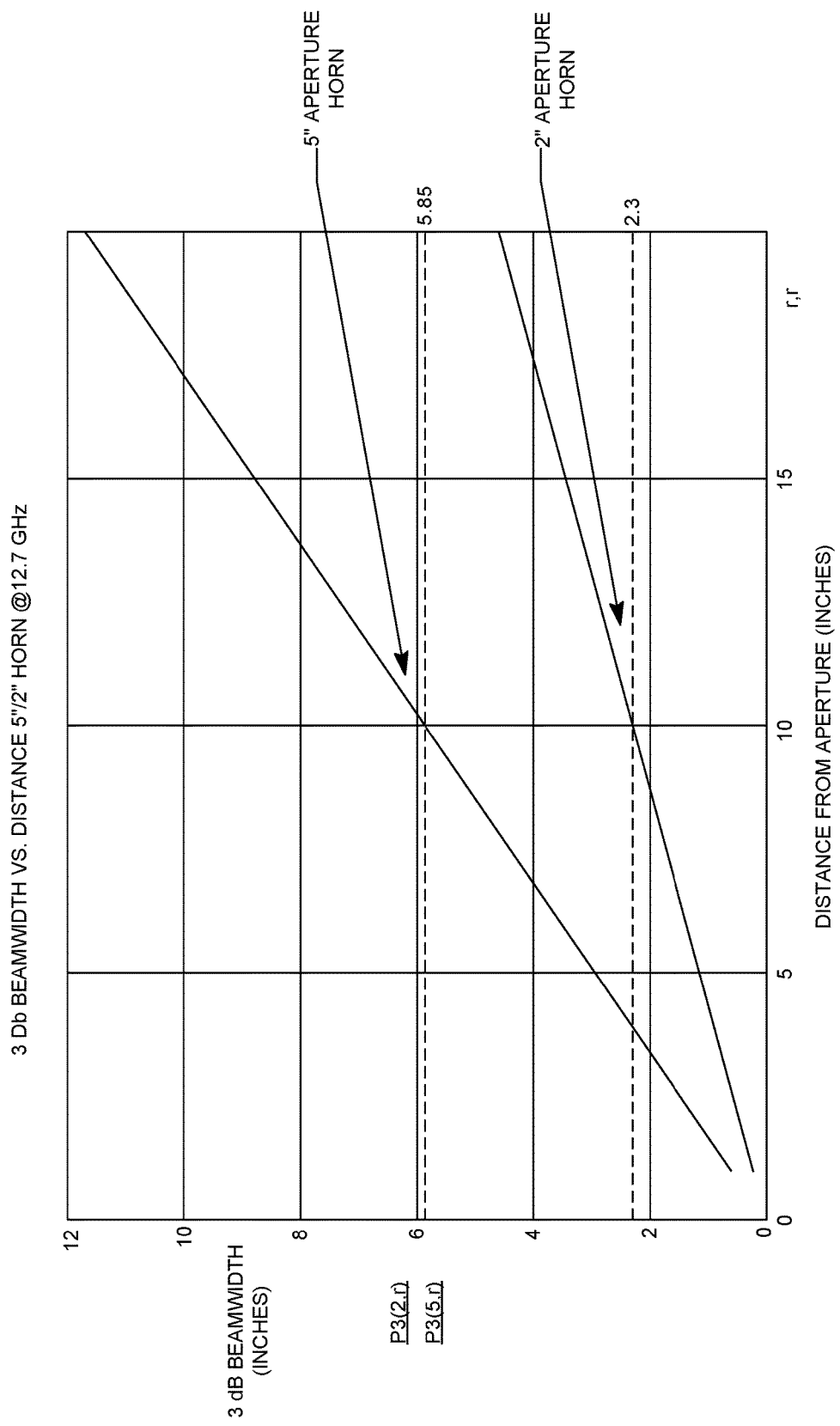
FIG. 8 illustrates the 3 dB beam width difference between a 5" aperture flight horn and a 2" aperture surrogate waveguide.

The benefits of a surrogate waveguide are demonstrated in the simulated test results in FIGS. 8 and 9. These figures are graphs showing differences between a 5" flight horn antenna and a 2" surrogate waveguide inserted into a 5" flight horn antenna. Benefits are shown at 10" from the flight horn aperture with a reference 1 watt transmitted at 12.7 GHz. FIG. 7 shows a 5" flight horn produces a simulated flux density of 0.126 watts/in^2, while the 2" surrogate waveguide produces only 0.026 watts/in^2. This is a reduction in flux density of almost 5 times at 10" from the horn by inserting the surrogate waveguide. FIG. 8 shows a related increase in beam width. At 10" from the flight horn aperture, the 3 dB beam width is 2.3" for the flight horn alone and 5.85" when the surrogate waveguide is inserted. This results in a 3 dB beam width spread over nearly 6.5 times the area with the surrogate waveguide as compared to the flight horn alone.

Figure 2:
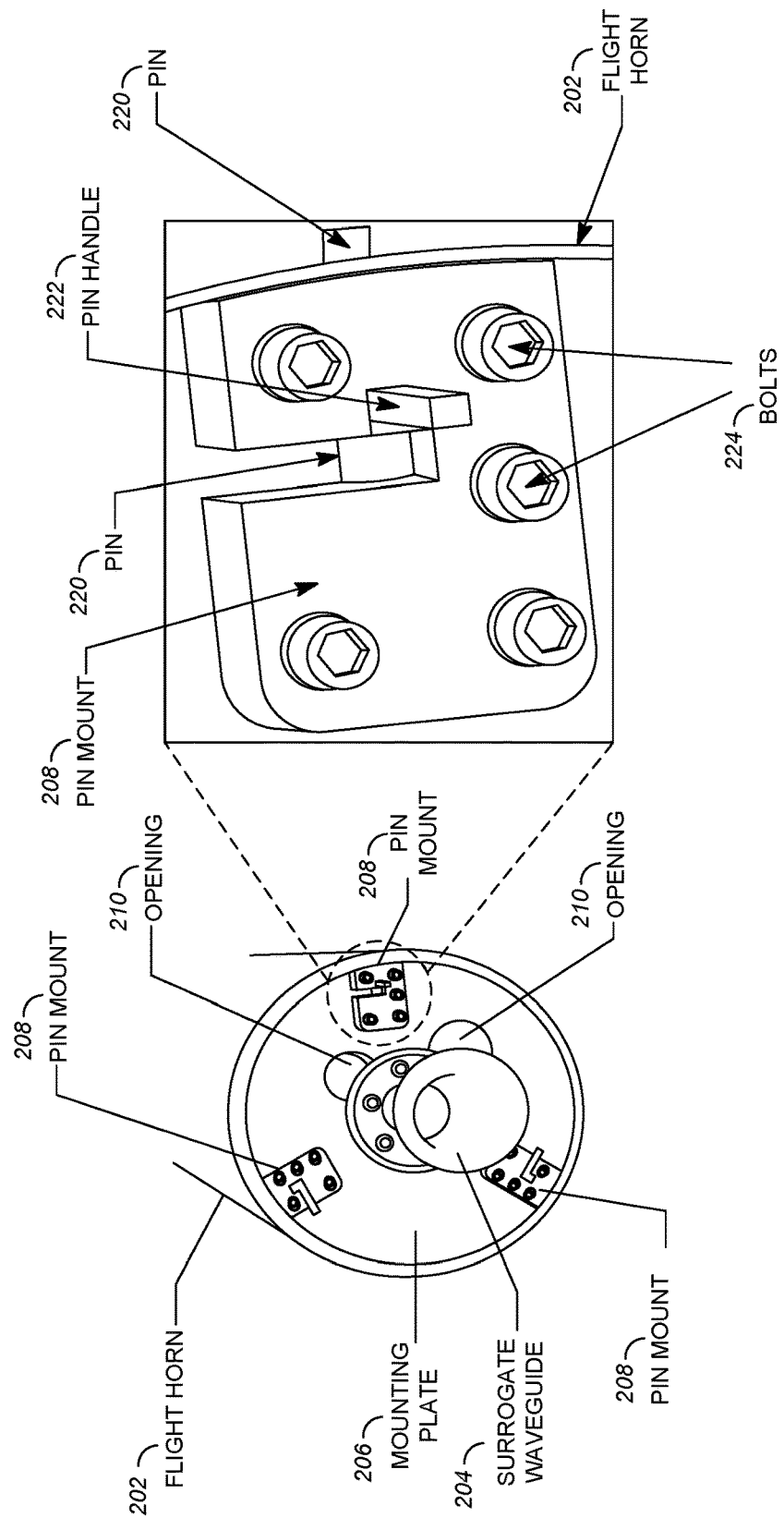
FIG. 2 illustrates a mounting plate used to mount a surrogate waveguide in a horn antenna.

FIG. 2 details an example of the mounting plate 106 from FIG. 1. The mounting plate 206 is mounted to flight horn 202 with three pins 220, each pin 220 in a pin mount 208. The pins insert into matched receiving holes in the flight horn 202 that are right next to the horn's aperture end. The three pin mounts 208 can be distributed unevenly around the circumference of the mounting plate (at positions somewhat greater and lesser than 120 degrees from each other) to ensure the mounting plate will mount in only one orientation. The pin mounts 208 can be affixed to the mounting plate 206 with bolts 224. Swiveling pins 220 can be disengaged or engaged with a matching receiving hole in the flight horn 202 by sliding the pin handle 222. It will be understood that many mechanisms for attaching a mounting plate 206 to a flight horn 202 exist, and these pins 220 and pin mounts 208 are just one example.

Figure 10:
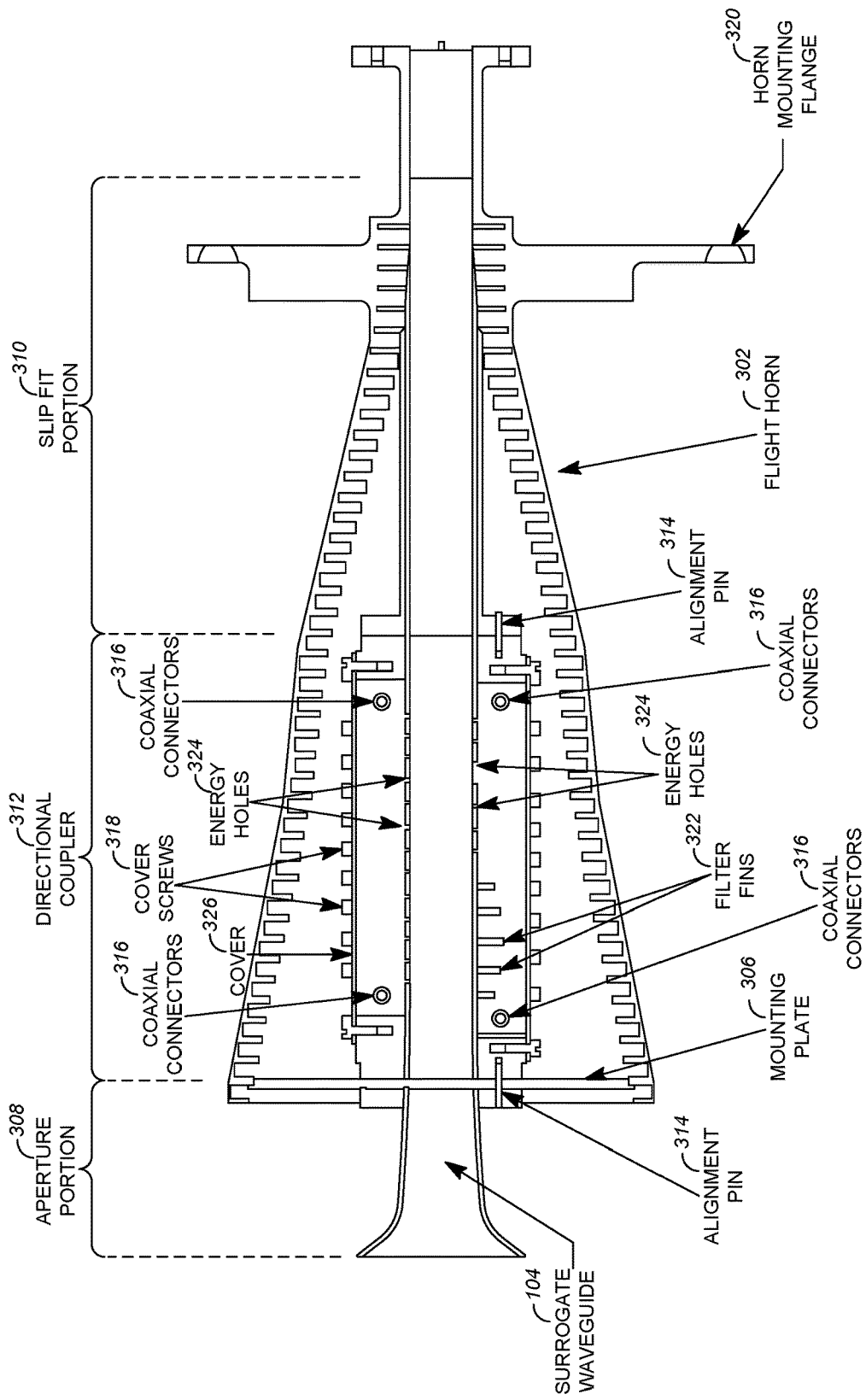
FIG. 10 illustrates another embodiment of a surrogate waveguide mounted in a horn antenna with an internal waveguide coupler.

The center of the mounting plate 206 can have a hole with shape and dimension of the surrogate waveguide 104 and this forms a portion of the surrogate waveguide 104 along with other portions attached to either side of the mounting plate 206. The mounting plate 206 can have one or more additional openings 210 to allow any energy to leak out that might build up between the flight horn 202 and the outside of the surrogate waveguide. The diameter of the openings 210 may be greater than or equal to half the wavelength of signals being tested (large enough to be above cutoff) to allow the energy in those signals to leak out, but the number and size of the holes 210 should be small enough to prevent most of the energy reflected back at the horn from re-entering and leaking into the horn slip-fit. The openings 210 also allow for venting and cable routing, for example if the surrogate waveguide has a coupler inside the flight horn 202 (as depicted in FIG. 10). Alternately, the mounting plate 206 may be affixed as a slip fit only to the exterior of the waveguide, have RF absorber such as Cuming Microwave SF material bonded to the inner surface of the mounting plate or be composed of an RF transparent thermal plastic.

Figure 3:
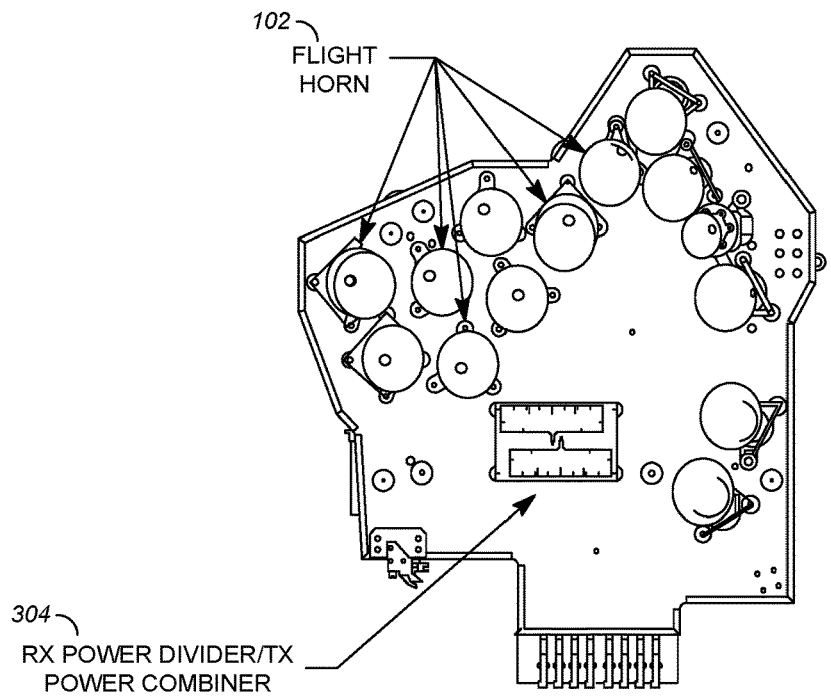
FIG. 3 illustrates a collection flight horns mounted on a satellite panel.

FIG. 3 depicts a group of flight horns as they might be arranged for a panel of a satellite. A satellite may have several such panels. In this panel, fourteen flight horns 102 are mounted together. Each of the horns is fitted with a surrogate waveguide, for example as depicted in FIG. 1. Each surrogate waveguide includes a single E-probe, for example, as depicted in FIG. 1. A 16:1 RX power divider/TX power combiner 304 is temporarily mounted on the panel, and the cables from the E-probes can then be connected to power divider/combiner.

Figure 4:
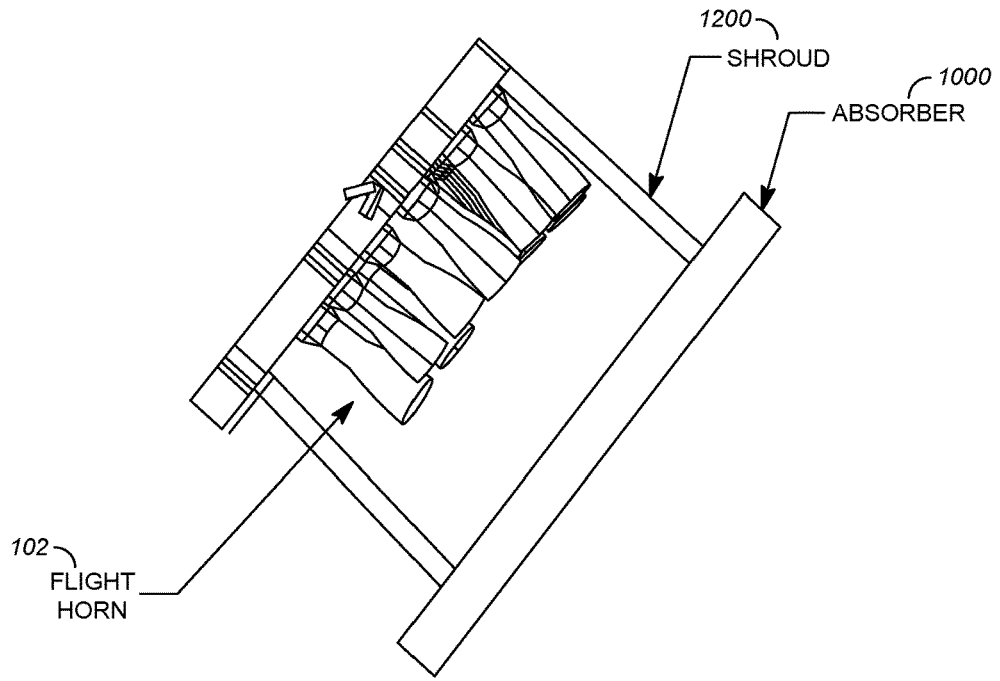
FIG. 4 illustrates a field aperture load (FAL) configuration for testing the flight horns of FIG. 3.

As depicted in FIG. 4, all fourteen flight horns 102 with surrogate waveguides are covered by a single FAL test configuration (surrogate waveguides not shown). Such a test configuration may include an actively cooled RF absorbent pad 1000 placed in front of flight horns 102 at approximately a 10° tilt from the direction of energy from the horns, and a shroud 1200 surrounding all four sides and all fourteen flight horns 102.

Figure 5:
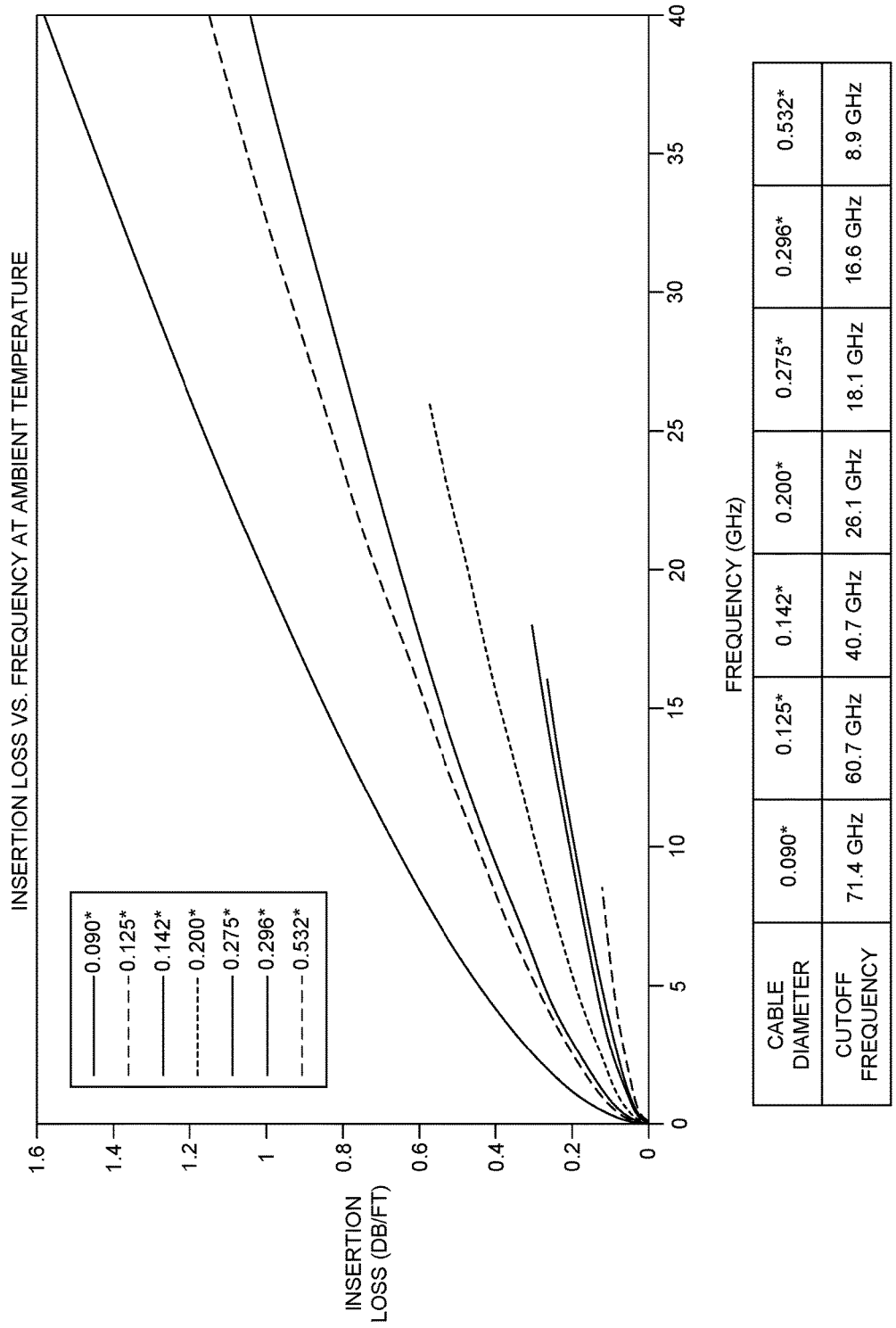
FIG. 5 is a graph of insertion loss (dB/ft.) vs frequency at ambient temperature for SiO2 high temperature lossy cables with approximately −0.7 to −0.8 dB/ft. loss at Ku band. The curves are for cable diameters of 0.090 in. to 0.532 in. and cutoff frequencies of 71.4 GHz to 8.9 GHz, as shown in the legend.

FIG. 5 is a graph of insertion loss (dB/ft.) vs frequency at ambient temperature for SiO2 high temperature lossy cables with approximately −0.7 to −0.8 dB/ft. loss at Ku band. The curves are for cable diameters of 0.090 in. to 0.532 in. and cutoff frequencies of 71.4 GHz to 8.9 GHz, as shown in the legend.

Figure 6:
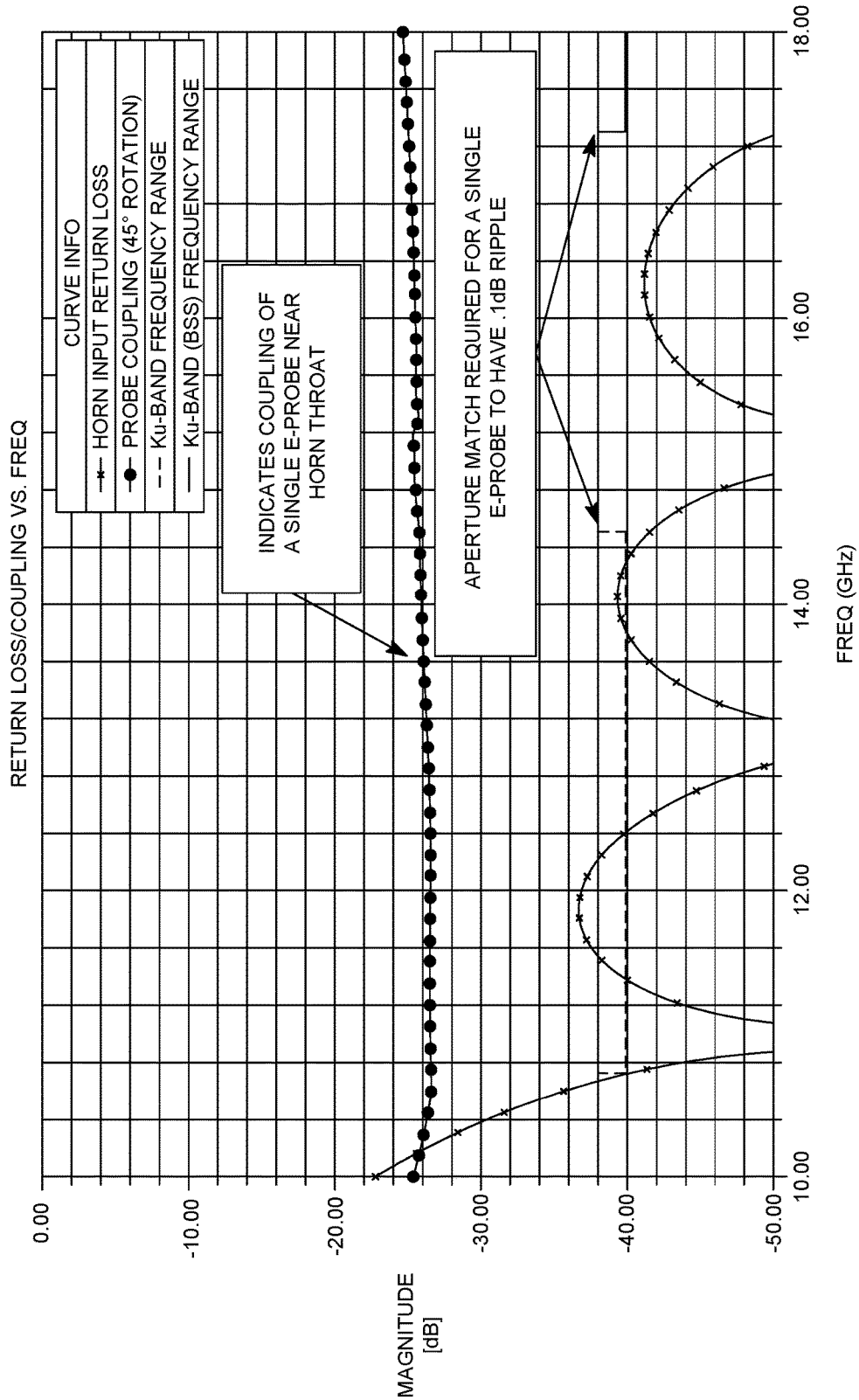
FIG. 6 depicts a graph of modeled coupling vs frequency of a single E-probe in combination with a highly matched spline horn that has virtually no ripple, and a graph of modeled return loss vs frequency of a spline horn matched to prevent reflections back to the single E-probe, showing that the combination of single E-probe and spline horn highly matched to free space can be used in place of a directional coupler without the disadvantage of excessive ripple.

FIG. 6 depicts a graph of modeled coupling vs frequency of a single E-probe that has virtually no ripple. In this graph, the units of the Y axis are coupling in dB. The E-probe in the graph has little ripple due to its use in combination with the inherent free space match of the compact spacecraft antenna Field Aperture Load Coupler spline horn). FIG. 6 also depicts a graph of return loss vs frequency of a horn matched to prevent reflections back to the single E-probe. Since this horn is matched to prevent reflections back to the single E-probe, this combination of single E-probe and spline horn matched to free space are used in place of a directional coupler without the disadvantage of excessive ripple.

An attenuator or a lossy cable can be used to improve the effective match at the probe to further match the system and avoid ripple. Therefore, the combination of low reflectivity free space absorber, spline horn, and attenuator and/or lossy cable will enable the use of a single electrically small waveguide E-probe to effectively couple RF energy in and out of a waveguide with minimal ripple to replace a directional coupler thus enabling use for higher power applications at reduced cost.

The Compact Spacecraft Antenna Field Aperture Load Coupler (U.S. patent application Ser. No. 14/273,329) is power limited to <300 watts in a vacuum due to the thermal constraints of the hybrid coupler, attenuator, and load. The single E-probe Field Aperture Load coupler in combination with a lossy cable that is painted with high temperature paint (up 2000° F.) can withstand >1000 watts limited primarily due to the Teflon in the SMA connector probe interface. This is demonstrated in the analysis shown in the table shown in FIGS. 9A and 9B. (Note: SMA, or SubMiniature version A, connectors are semi-precision coaxial RF connectors developed as a minimal connector interface for coaxial cable with a screw type coupling mechanism. The connector has an impedance of 50Ω.)

FIG. 10, which is reproduced from FIG. 3 of U.S. patent application Ser. No. 14/273,329, illustrates a surrogate waveguide 104 with a directional coupler that fits inside the flight horn 302 and mounting plate 306. In this example, the slip-fit portion 310 of the surrogate waveguide 104 is again slip-fit into the narrow waveguide end of the flight horn 302, but the other end of the slip-fit portion is attached to a directional coupler 312 portion of the surrogate waveguide, which then connects to the mounting plate 306, and then finally connects to the aperture portion 308 of the surrogate waveguide 104. Alignment pins 314 can ensure the separate portions of the surrogate waveguide are attached to each other in only one alignment, enabling careful alignment to, for example, certain polarizations of the electric field. The directional coupler 312 may be comprised of three aligned air spaces at a 45-degree angle relative to the electric and the magnetic field. The horn mounting flange 320 can be used for mounting the flight horn 302 to a satellite, and it will be understood that flange 320 may not exist in other examples, or may be of different shape or position as is appropriate for any particular application of a flight horn 302.

Figure 11:
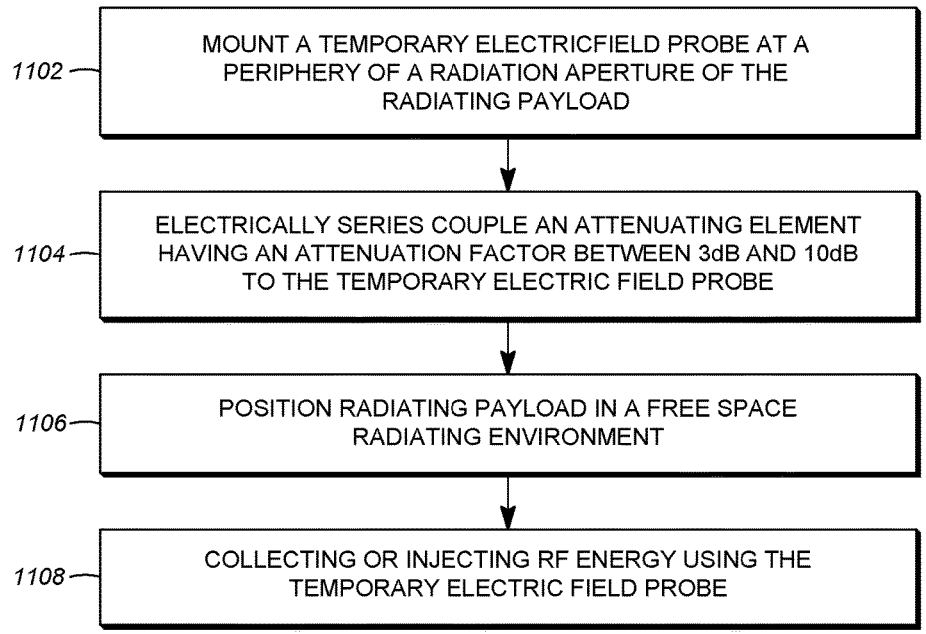
FIG. 11 is a diagram illustrating exemplary operations that can be used to practice a second embodiment of the test apparatus and technique in which a single temporary electric field probe is mounted at a periphery of the radiation aperture of a radiating payload.

Single E-Probe Field Aperture Coupler Mounted at the Periphery of the Radiation Aperture FIG. 11 is a diagram illustrating exemplary operations that can be used to practice a second embodiment of the test apparatus and technique in which a single temporary electric field probe 113 is mounted at a periphery of the radiation aperture of a radiating payload. FIG. 11 will be discussed in conjunction with FIGS. 13A-17, which illustrate exemplary embodiments of means by which the single temporary electric field probe 113 is mounted at the periphery of the radiation aperture of the radiating payload.

Turning first to FIG. 11, a temporary electric field probe (or E-probe) 113 is mounted at a periphery of a radiation aperture of a radiating payload, as shown in block 1102.

Figure 12:
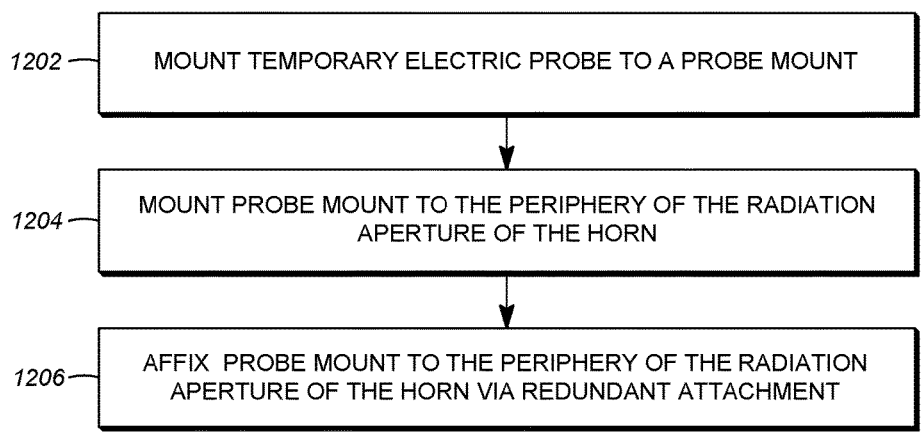
FIG. 12 is a diagram presenting exemplary operations that can be used to mount the temporary E-probe to the periphery of the radiation aperture of the radiating payload in an embodiment in which the radiating payload comprises a horn having the radiating aperture.

FIG. 12 is a diagram presenting exemplary operations that can be used to mount the temporary E-probe 113 to the periphery of the radiation aperture of the radiating payload in an embodiment in which the radiating payload comprises a flight horn having the radiating aperture. FIG. 12 is discussed in conjunction with FIGS. 13A-13D, which illustrates application of the operations of FIG. 12 to a hardware embodiment in which the probe mount 1302 comprises a sheet metal tab and the radiating payload comprises a flight horn 102.

Referring now to FIG. 12, in block 1202, the temporary E-probe 113 is mounted to a probe mount 1302. As shown in detail in FIG. 13A, the probe mount 1302 has a first aperture 1314 through which a conductor 1313 of the temporary E-probe 113 is inserted. The probe mount 1302 also includes a plurality of mounting apertures that permit fasteners such as screws 1316 to be inserted through the probe mount 1302 and into the probe 113 to affix the probe 113 to the probe mount 1302.

Figure 13A:
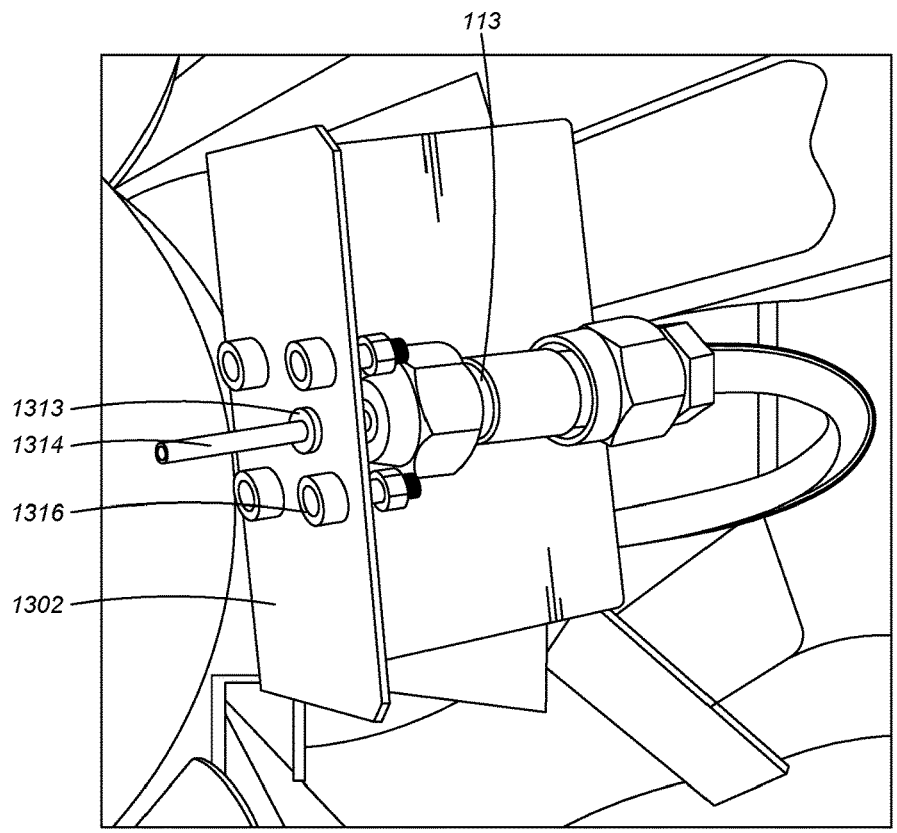
FIGS. 13A-13D, which illustrates application of the operations of FIG. 12 to a hardware embodiment in which the probe mount comprises a sheet metal tab and the radiating payload comprises a horn.
Figure 13B:
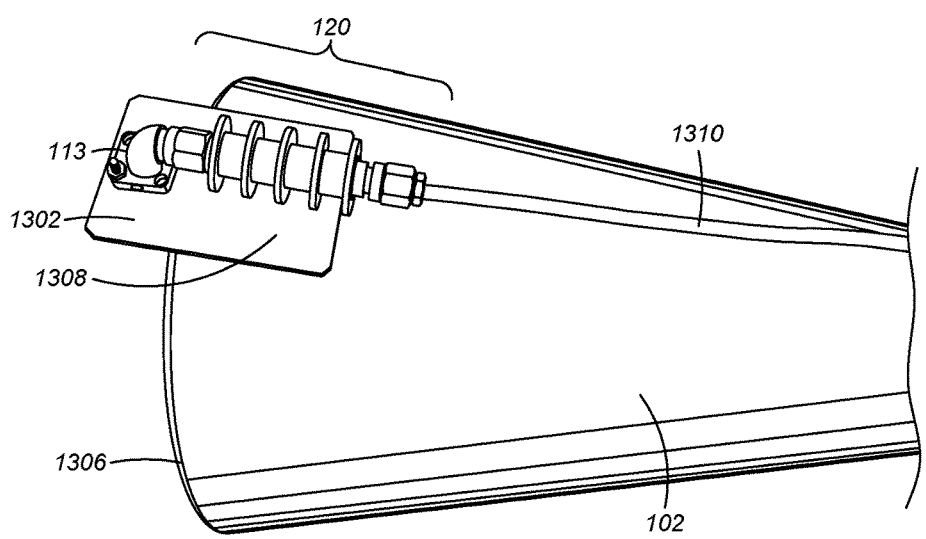

In block 1204, the probe mount 1302 (with the temporary E-probe 113) is mounted to the periphery of the radiation aperture 1306 of the radiating payload. In the illustrated embodiment FIG. 13b, the radiating payload comprises a thin-wall flight horn 102 having a smooth external surface. This may be accomplished, for example, by careful cleaning of the outside surface of the flight horn 102 with alcohol or other solvent, applying a removable pressure sensitive adhesive (PSA) of suitable thickness (for example, 0.005 mil) to either the flight horn 102 or the probe mount 1302, then applying pressure to the probe mount 1302 to adhere it to the periphery of the flight horn aperture. FIG. 13B is a diagram illustrating the mounting of the probe mount 1302 having the temporary E-probe 113 on the periphery of the radiation aperture 1306 of the flight horn 102 of the radiating payload.

Figure 13C:
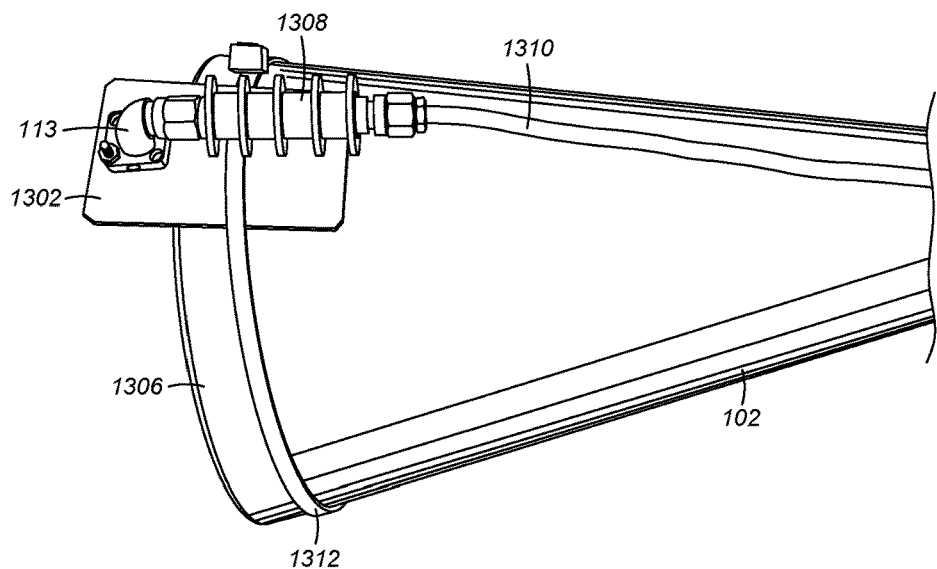
Figure 13D:
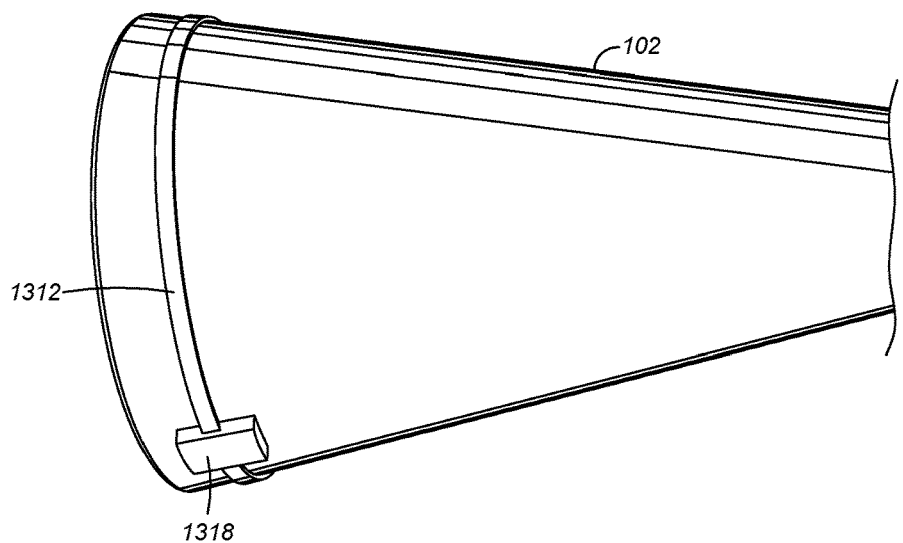

In block 1206, the probe mount (with the temporary E-probe 113) is further affixed to the periphery of the radiation aperture of the flight horn via a redundant attachment. FIG. 13C illustrates one embodiment of the redundant attachment 1312. In the illustrated embodiment, the redundant attachment 1312 comprises a compressive restraining strap wrapped around the outer surface of the flight horn 102 and the probe mount 1302 and/or probe 113 such as a zip-tie. Other redundant attachment means may be used, for example a hose clamp or similar. In the illustrated embodiment, the strap is held in place by placing the strap through the hook element and pile element of a hook and pile fastener 1318 such as a VELCRO fastener. This prevents the strap from sliding from the larger diameter portions of the flight horn 102 to the lower diameter portions of the flight horn 102.

Returning to FIG. 11, in block 1104, an attenuating element 120 electrically series-coupled to the temporary E-probe 113. The attenuating element 120 may comprise an attenuator 1308, a lossy cable 1310, or both. In one embodiment, the lossy cable 1310, in combination with the return loss of the probe and attenuator 1308 (if any) results in a maximum return loss of 18 dB at the input to the lossy cable 1310. In embodiments using an attenuator 1308 without a lossy cable (as shown), the attenuator may be a 10 watt 10 dB, attenuator, 6 dB attenuator, or 3 dB attenuator, depending upon the application.

Note that in the embodiment illustrated in FIG. 13C, the attenuator 1308 comprises heat sink having a plurality of fins. In this embodiment, the redundant attachment 1312 is disposed not only around the probe mount 1302 with the attached temporary E-probe 113, but also between the fins of the heat sink, thus further securing the probe mount 1302 to the periphery of the flight horn 102 aperture from motion perpendicular to the plane of the radiation aperture 1306.

In block 1106, the radiating payload is positioned in a free space radiating environment. An exemplary free space radiating environment 101 is disclosed in FIG. 1, and comprises the RF absorber 1000 that has low reflectivity such that the total reflection loss of the absorber plus free space loss is equal to or less than −37 dB coupling back to probe 113.

In one embodiment, reflected RF energy returned to the temporary E-probe 113 from the free space radiating environment (due to absorption by the RF absorber 1000 and free space spreading) is at most −37 dB in the frequency bands of interest (particularly L-band). This assures that the ripple in measurements (reflecting phase differences between what is emitted from the radiation aperture and what is reflected back from the free-space environment 101) is about 0.25 dB or less. The RF energy returned to the temporary E-probe 113 is primarily a function of the distance from the radiating aperture and the absorption provided by the RF absorber 1000.

In block 1108, RF energy is collected or injected using the temporary E-probe 113.

The operations performed in blocks 1102-1106 may be performed in any order. For example, the attenuating element may be electrically series coupled to the temporary E-probe 113 (block 1104) before mounting the temporary E-probe 113 at the periphery of the radiation aperture of the radiating payload (block 1102), and either of these operations may be performed before or after the radiating payload is positioned within the free-space radiating environment as described in block 1106.

Typically, only one temporary E-probe 113 is required. The rotational position of the temporary E-probe 113 must align with the E-field of a single linear polarization. For example, in embodiments wherein the RF energy includes both horizontally polarized RF energy and vertically polarized RF energy, the temporary E-probe 113 is mounted at an angle between the horizontally polarized RF energy and the vertically polarized RF energy substantially equal to 45 degrees. Alternatively, in embodiments where the RF energy comprises horizontally polarized RF energy and vertically polarized RF energy, two temporary E-probes 113 may be used: a first temporary electric field probe that is copolarized with the horizontally polarized RF energy may be mounted at the radiation aperture of the radiating payload, and a second temporary electric field probe that is copolarized with the vertically polarized RF energy may be mounted at the radiation aperture of the radiating payload.

Further, in embodiments in which the RF energy is circularly polarized, the temporary E-probe 113 can be mounted to sense a single linear polarization of the circularly polarized RF energy, for example, the vertical polarization of the circularly polarized RF energy.

Figure 14A:
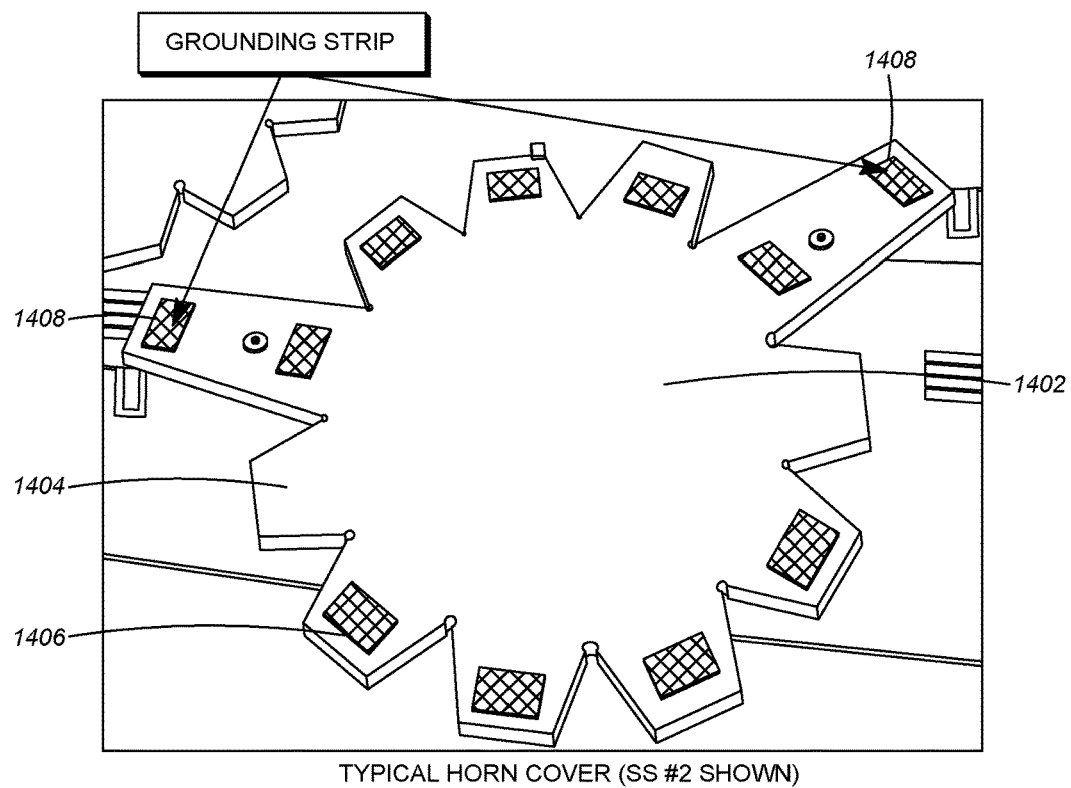
FIGS. 14A-14B are diagrams illustrating one embodiment of a typical cover such as a sunshield that is used to protect the horn of the radiating payload when deployed.
Figure 14B:
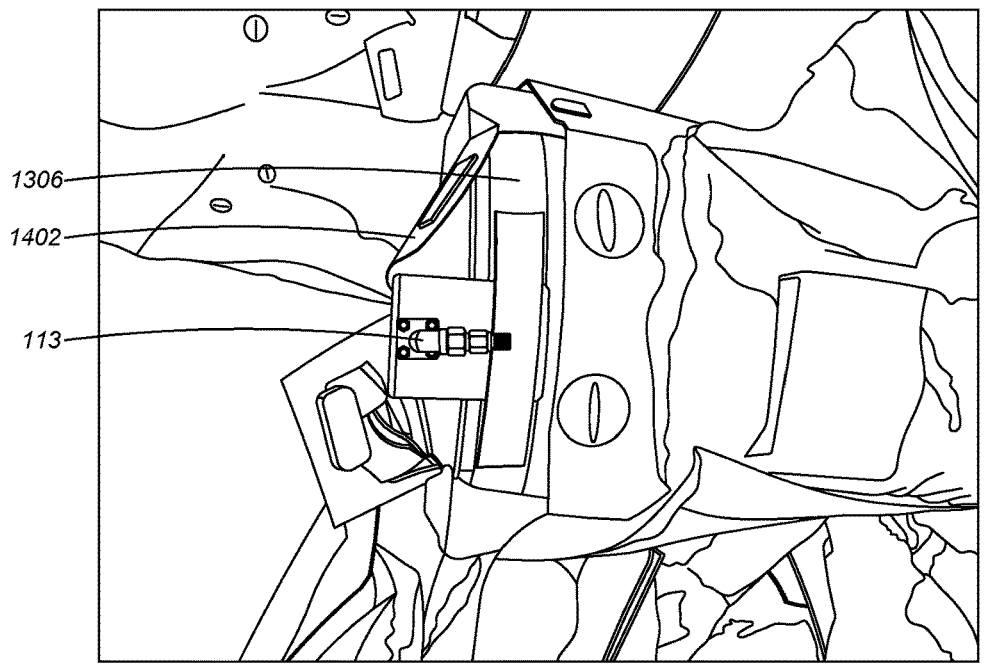

FIGS. 14A-14B are diagrams illustrating one embodiment of a typical cover 1402 such as a sunshield that is used to protect the flight horn 102 of the radiating payload when deployed. The cover 1402 includes a plurality of tabs 1404, and one or more grounding strips 1408. One or more of the tabs 1404 and grounding strips 1408 include fasteners 1406 that physically adhere the cover 1402 to fastener bases placed exterior surfaces of the flight horn 102 adjacent the radiation aperture 1306. Such fasteners may include VELCRO fasteners, which comprise an attachment portion adhered to the inside surface of the cover 1402 and base portions adhered to the exterior surface of the flight horn 102. The non-tabbed portion of the cover 1402 is sized to fit over the radiation aperture 1306, with the tabs 1404 folding over the flight horn 102.

Since measurements of radiating payload are affected by the presence of the cover 1402, and the temporary E-probe must be on the periphery of the radiating payload under the cover 1402. This can be accomplished by removing a plurality of tabs 1404 from the cover 1402, and carefully unadhering one of the base attachment portions from the exterior surface of the flight horn 102. After cleaning the portion of the exterior surface of the flight horn 102 from which the base attachment portion was removed, the probe mount 1302 with the temporary E-probe 113 is installed at the appropriate position (given the RF electric field) along the periphery of the flight horn 102 by use of the pressure sensitive adhesive on the probe mount 1302 surface and/or the flight horn 102 exterior surface. Then, the grounding strips 1408 and tabs 1404 can be redressed or reattached, except a tab 1404 in the vicinity of the location of the probe mount 1302 and temporary E-probe 113. The remaining tab 1404 without an associated base attachment portion may be left to rest over the top of the temporary E-probe 113 during testing, with a strip of KAPTON tape or VELCRO at the top of the temporary E-probe 113 to protect its interaction with the cover 1402.

FIG. 14B is a diagram illustrating the result of the foregoing procedure to insert the temporary E-probe 113 under the cover 1402. After testing, the probe mount 1302 with the temporary E-probe 113 may be removed, the surface where the probe mount 1302 was formerly adhered to cleaned with alcohol to remove the adhesive, and a new base attachment portion attached. Then, the remaining tab 1404 of the cover may be closed by folding it over and press-fitting the attachment portions together.

In embodiments in which the probe 113 cannot be inserted under the cover that will be used when the radiation payload is deployed, the cover 1402 may be replaced by a non-flight cover constructed of TYVEK.

Figure 15A:
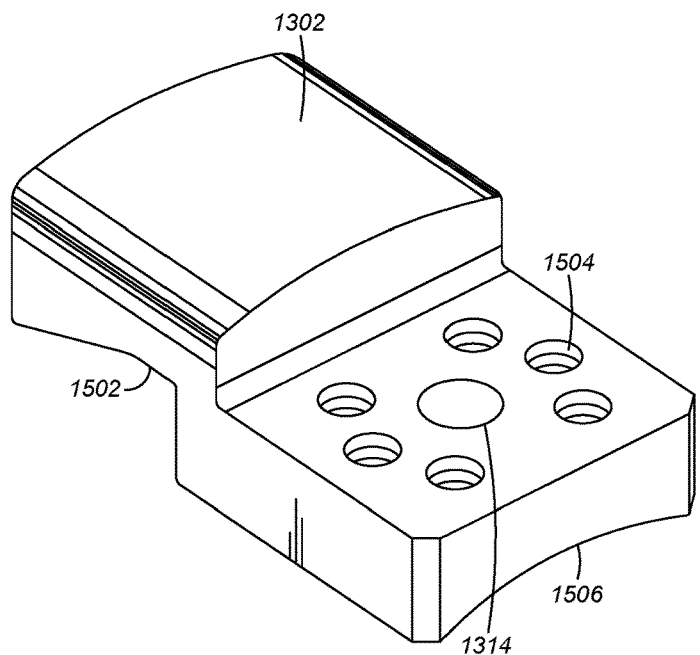
FIGS. 15A and 15B are diagrams illustrating the use of a different embodiment of the probe mount.
Figure 15B:
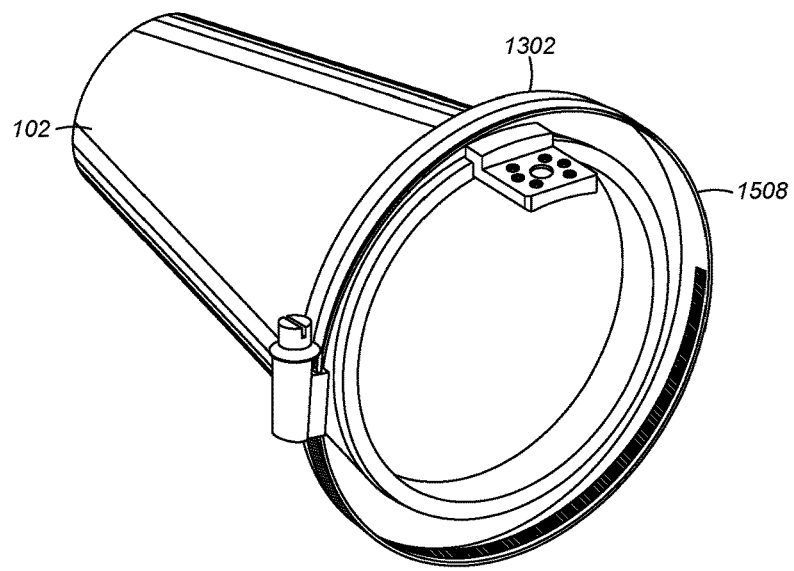

FIGS. 15A and 15B are diagrams illustrating the use of a different embodiment of the probe mount 1302. This embodiment is most useful with radiation payloads having flight horns 102 that are more robust than the flight horns illustrated in FIGS. 13A-13D. In this embodiment, the probe mount 1302 comprises a rigid bracket that has a flight horn-facing surface 1502 shaped to substantially match the outer surface at the periphery of the flight horn 102. The rigid bracket may be machined from aluminum or similar material, and can be attached to a portion of the flight horn 102 having an exterior surface substantially matching flight horn facing surface 1502. This embodiment of the probe mount 103 may be affixed to the exterior surface or the flight horn 102 via an adhesive and/or other means, but preferably, is affixed via a zip-tie clamp or such as the illustrated hose clamp 1508 mounted around the circumference of the radiation aperture of the flight horn 102. This embodiment of the probe mount 1302 also includes a first aperture 1314 through which a conductor 1313 of the temporary E-probe 113 is inserted. The probe mount 1302 also includes a plurality of mounting apertures 1504 that permit fasteners such as screws to be inserted through the probe mount 1302 and into the probe 113 to affix the probe 113 to the probe mount 1302.

Figure 16:
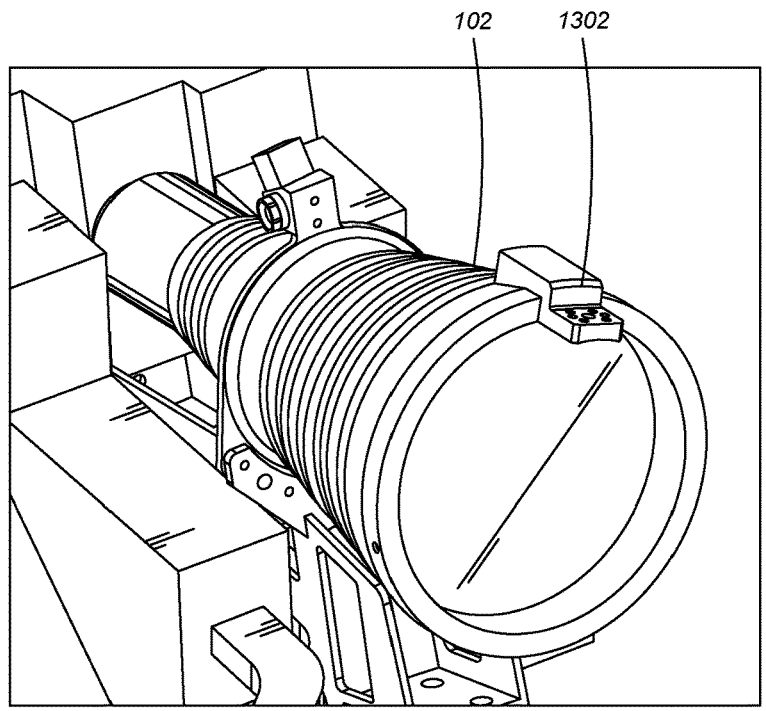
FIG. 16 is a diagram illustrating an embodiment wherein the interior surface of the horn is corrugated.

FIG. 16 is a diagram illustrating an embodiment wherein the interior surface 1602 of the flight horn 102 is corrugated. In this embodiment, the probe mount 1302 flight horn matching surface is machined to match the exterior contour of the flight horn and that the probe mount aperture facing surface matches in-line with the horn aperture interior surface.

Figure 17:
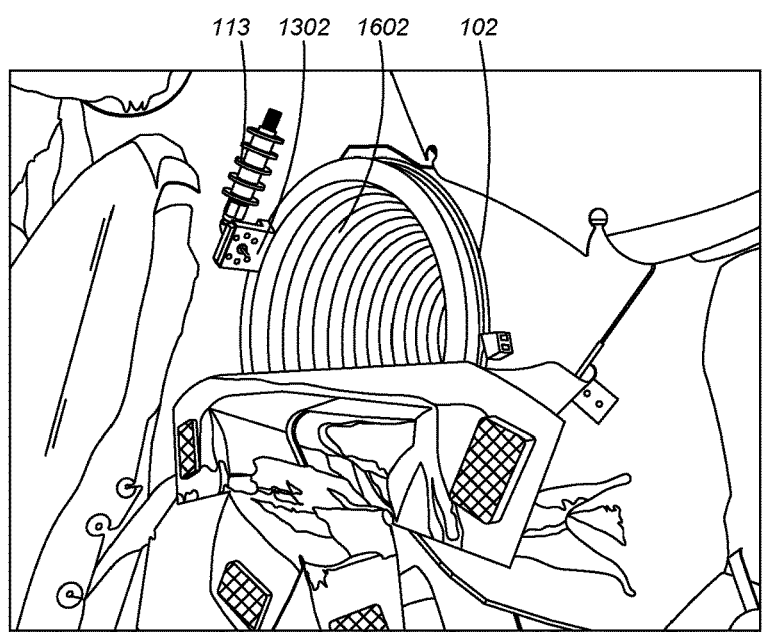
FIG. 17 is a diagram illustrating another embodiment of the probe mount and temporary E-probe mounted on a horn via a zip-tie disposed around the periphery of the horn near the radiation aperture.

FIG. 17 is a diagram illustrating another embodiment of the probe mount 1302 and temporary E-probe 113 mounted on a flight horn 102 via a zip-tie around the periphery of the flight horn 102 near the radiation aperture.

CONCLUSION

The true scope of the present disclosure is not limited to the illustrative embodiments disclosed herein. For example, the foregoing disclosure of a single E-Probe reduced aperture waveguide coupler uses explanatory terms, such as E-probe, SMA connector, waveguide, spline horn, and the like, which should not be construed so as to limit the scope of protection of this application, or to otherwise imply that the inventive aspects of the illustrative embodiments are limited to the particular methods and apparatus disclosed. Thus, nothing in the foregoing description is intended to imply that any particular structural feature, step, or configuration is indispensable. Indeed, the novel methods and systems described herein may be embodied in a variety of other forms; furthermore, various omissions, substitutions and changes in the form of the methods and systems described herein may be made without departing from the spirit of the disclosures herein. The accompanying claims are intended to cover such forms or modifications as would fall within the scope of the disclosures herein.

What is claimed is:

1. A method of measuring a characteristic of a radiating payload, comprising:
   mounting a temporary electric field probe at a periphery of a radiation aperture of the radiating payload;
   electrically series coupling an attenuating element having an attenuation factor of between 3 dB and 10 dB to the temporary electric field probe;
   positioning the radiating payload in a free space radiating environment; and
   collecting or injecting radio frequency (RF) energy using the temporary electric field probe.

2. The method of claim 1, wherein reflected RF energy returned to the temporary electric field probe from the free space radiating environment is at most −37 dB.

3. The method of claim 2, wherein mounting a temporary electric field probe at the periphery of a radiation aperture of the radiating payload comprises:
   mounting only one temporary electric field probe on the radiation aperture of the radiating payload.

4. The method of claim 3, wherein:
   the RF energy comprises horizontally polarized RF energy and vertically polarized RF energy; and
   mounting only one temporary electric field probe on the radiation aperture of the radiating payload comprises:
   mounting the only one temporary electric field probe on the radiation aperture of the radiating payload at an angle between the horizontally polarized RF energy and the vertically polarized RF energy substantially equal to 45 degrees.

5. The method of claim 3, wherein:
   the RF energy comprises circularly polarized RF energy; and
   mounting only one temporary electric field probe on the radiation aperture of the radiating payload comprises:

mounting the only one temporary electric field probe for a single linear polarization of the circularly polarized RF energy.

6. The method of claim 5, wherein mounting the only one temporary electric field probe for a single linear polarization of the circularly polarized RF energy comprises:
mounting the only one temporary electric field probe for a vertical polarization of the circularly polarized RF energy.

7. The method of claim 1, wherein
the RF energy comprises horizontally polarized RF energy and vertically polarized RF energy; and
mounting a temporary electric field probe at the periphery of the radiation aperture of the radiating payload comprises:
mounting a first temporary electric field probe copolarized with the horizontally polarized RF energy at the periphery of the radiation aperture of the radiating payload; and
mounting a second temporary electric field probe co-polarized with the vertically polarized RF energy at one of a periphery of a radiation aperture of the radiating payload.

8. The method of claim 1, wherein the attenuating element comprises at least one of an attenuator and a lossy cable.

9. The method of claim 8, wherein the attenuating element comprises:
a lossy cable having in combination with a return loss of probe, has a maximum return loss of −18 dB at an input of the lossy cable.

10. The method of claim 1, wherein:
the free space radiating environment comprises a radiation absorbing surface facing the radiation aperture of the radiating payload having an absorption plus free space spreading loss of at least 37 dB.

11. The method of claim 1, wherein:
the radiating payload comprises a horn having the radiating aperture;
mounting the temporary electric field probe at the periphery of the radiation aperture comprises:
mounting the temporary electric field probe to a probe mount; and
mounting the probe mount to the periphery of the radiation aperture of the horn.

12. The method of claim 11, wherein the horn comprises a smooth external thin-wall surface and wherein:
the probe mount comprises a sheet metal tab is mounted to the periphery of the radiation aperture via an adhesive.

13. The method of claim 12, further comprising:
affixing the adhered probe mount to the periphery of the radiation aperture with a redundant attachment.

14. The method of claim 13, wherein the redundant attachment comprises:
a strap or hose clamp around the probe mount and the horn; and
a hook and pile fastener affixed to the horn, the strap disposed between the hook and pile.

15. The method of claim 14, wherein the attenuating element comprises at a plurality of fins and the strap or hose claim is secured between two of the fins.

16. The method of claim 11, wherein:
the radiating payload comprises a cover disposed over the radiating aperture, and the temporary electric field probe is mounted under the cover.

17. The method of claim 11, wherein:
the horn comprises a corrugated internal surface; and
the probe mount comprises a probe bracket having a surface substantially conforming to at least a portion of an external surface contour of the horn.

18. An apparatus of measuring a characteristic of a radiating payload radiating RF energy, comprising:
a free space radiating environment;
a temporary electric field probe, mounted at a periphery of a radiation aperture of the radiating payload; and
an attenuating element having an attenuation factor of between 3 dB and 10 dB, electrically series coupled to the temporary electric field probe.

19. The apparatus of claim 18, wherein reflected RF energy returned to the temporary electric field probe from the free space radiating environment is at most −37 dB.

20. The apparatus of claim 19, wherein only one temporary field probe is mounted on the radiation aperture of the radiating payload.

21. The apparatus of claim 20, wherein:
the RF energy comprises horizontally polarized RF energy and vertically polarized RF energy; and
the only one temporary electric field probe the radiation aperture of the radiating payload is mounted at an angle between the horizontally polarized RF energy and the vertically polarized RF energy substantially equal to 45 degrees.

22. The apparatus of claim 18, wherein
the RF energy comprises horizontally polarized RF energy and vertically polarized RF energy;
the temporary electric field probe is a first temporary electric field probe copolarized with the horizontally polarized RF energy and is mounted at the periphery of a radiation aperture of the radiating payload; and
the apparatus further comprises a second temporary electric field probe co-polarized with the vertically polarized RF energy and mounted at the periphery of a radiation aperture of the radiating payload.

23. The apparatus of claim 20, wherein:
the RF energy comprises circularly polarized RF energy; and
the only one temporary electric field probe is mounted for a single linear polarization of the circularly polarized RF energy.

24. The apparatus of claim 18, wherein the attenuating element comprises at least one of an attenuator and a lossy cable.

25. The apparatus of claim 24, wherein the attenuating element comprises:
a lossy cable having in combination with a return loss of probe, has a maximum return loss of −18 dB at an input of the lossy cable.

26. The apparatus of claim 18, wherein the temporary electric field probe is mounted externally on the periphery of the radiation aperture.

27. The apparatus of claim 26, wherein:
the radiating payload comprises a horn having the radiating aperture;
the temporary electric field probe is mounted to a probe mount; and
the probe mount is mounted on the periphery of the radiating aperture of the horn.

28. The apparatus of claim 27, wherein:
the probe mount is affixed to the periphery of the radiation aperture of the horn with a removable adhesive and affixed with a strap around the probe mount and the horn.

29. The apparatus of claim 18, wherein:
the free space radiating environment comprises a radiation absorbing surface facing the radiation aperture of the radiating payload having an absorption plus free space spreading loss of at least 37 dB.

* * * * *